(12) United States Patent
Zhong (10) Patent No.: US 8,138,608 B2
(45) Date of Patent: Mar. 20, 2012

(54) INTEGRATED CIRCUIT PACKAGE SUBSTRATE HAVING CONFIGURABLE BOND PADS

(75) Inventor: Chonghua Zhong, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/691,255

(22) Filed: Jan. 21, 2010

(65) Prior Publication Data

US 2010/0117245 A1     May 13, 2010

Related U.S. Application Data

(63) Continuation of application No. 12/038,502, filed on Feb. 27, 2008, now Pat. No. 7,683,495.

(51) Int. Cl.
  *H01L 23/48* (2006.01)
  *H01L 23/52* (2006.01)
(52) U.S. Cl. .... 257/773; 257/786; 257/778; 257/E23.02
(58) Field of Classification Search .................. 257/786, 257/773, 778, E23.02, 86, E23.027
  See application file for complete search history.

(56) References Cited

U.S. PATENT DOCUMENTS

| | | | |
|---|---|---|---|
| 6,037,667 A | 3/2000 | Hembree et al. | |
| 6,373,130 B1 | 4/2002 | Salaville et al. | |
| 6,897,555 B1 | 5/2005 | Lim et al. | |
| 7,276,802 B2 | 10/2007 | Hall et al. | |
| 7,391,118 B2 | 6/2008 | Tsai | |
| 7,586,199 B1 * | 9/2009 | Leistiko et al. | 257/773 |
| 7,683,495 B2 | 3/2010 | Zhong | |
| 2002/0113323 A1 | 8/2002 | Nakanishi et al. | |
| 2003/0132529 A1 * | 7/2003 | Yeo et al. | 257/778 |
| 2005/0023704 A1 * | 2/2005 | Lin et al. | 257/781 |
| 2005/0269684 A1 * | 12/2005 | Baek et al. | 257/691 |
| 2005/0287829 A1 * | 12/2005 | Ichikawa | 439/66 |
| 2009/0212443 A1 | 8/2009 | Zhong | |

* cited by examiner

*Primary Examiner* — Nitin Parekh
(74) *Attorney, Agent, or Firm* — Fiala & Weaver P.L.L.C.

(57) ABSTRACT

Methods, systems, and apparatuses for integrated circuit package substrates, integrated circuit packages, and processes for assembling the same, are provided. A substrate for a flip chip integrated circuit package includes a substrate body having opposing first and second surfaces. A solder mask layer covers at least a portion of the first surface of the substrate body. First and second electrically conductive features are formed on the substrate body. The first electrically conductive feature is a portion of a first electrical signal net, and the second electrically conductive feature is a portion of a second electrical signal net. The first and second electrically conductive features are configured to be selectively electrically coupled together by application of an electrically conductive material. The electrically conductive material may be a conductive epoxy, a jumper, a solder paste, a solder ball, or a solder bump that couples a flip chip die to the substrate.

16 Claims, 9 Drawing Sheets

602
form a first electrically conductive feature and a second electrically conductive feature on a first surface of a substrate in a configuration that enables the first and second electrically conductive features to be selectively electrically coupled together by application of an electrically conductive material 604
apply a solder mask layer over at least a portion of the first surface of the substrate

1802 flip chip mount an integrated circuit die to the first surface of the substrate with a plurality of solder bumps such that a solder bump of the plurality of solder bumps is the electrically conductive material

INTEGRATED CIRCUIT PACKAGE SUBSTRATE HAVING CONFIGURABLE BOND PADS

This application is a continuation of allowed U.S. application Ser. No. 12/038,502, filed on Feb. 27, 2008, which is incorporated by reference herein in its entirety.

BACKGROUND OF THE INVENTION

1. Field of the Invention

The present invention relates to integrated circuit packaging technology, and more particularly to flip chip integrated circuit package substrates.

2. Background Art

Integrated circuit (IC) chips or dies from semiconductor wafers are typically interfaced with other circuits using a package that can be attached to a printed circuit board (PCB). One such type of IC die package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB.

In some BGA packages, a die is attached to the substrate of the package (e.g., using an adhesive), and signals of the die are interfaced with electrical features (e.g., bond fingers) of the substrate using wire bonds. In such a BGA package, wire bonds are connected between signal pads/terminals of the die and electrical features of the substrate. In another type of BGA package, which may be referred to as a "flip chip package," a die may be attached to the substrate of the package in a "flip chip" orientation. In such a BGA package, solder bumps are formed on the signal pads/terminals of the die, and the die is inverted ("flipped") and attached to the substrate by reflowing the solder bumps so that they attach to corresponding pads on the surface of the substrate.

Flip chip package substrates are typically very expensive, for various reasons. A flip chip substrate requires a relatively high number of layers for an integrated circuit package substrate, causing costs to increase. The complexity of flip chip package substrates frequently leads to lengthy and expensive manufacturing processes for the substrates. Furthermore, non-recurring engineering (NRE) costs related to the design and manufacturing of flip chip substrates may be high. The advanced high density routing requirements for flip chip substrates typically lead to very expensive photolithography masks.

For BGA packages that include wire bonds, various functions of the die can be turned on/off through the use of wire bonds. For example, a first signal net of the BGA package can be activated by wire bonding a signal of the die to the first signal net. A second signal net may be deactivated by not wire bonding to the second signal net, or by wire bonding the second signal net to a deactivation voltage. Thus, wire bond packages offer some functional flexibility due to the use of wire bonds. Such functional flexibility enables some functional modifications to made to a wire bond BGA package without having to significantly alter the BGA package. However, flip chip packages do not provide such functional flexibility, because solder bumps of the die can only connect to pads of the substrate that are directly opposite the solder bumps. There is no ability to connect a solder bump of the die to an alternative substrate pad. Thus, when functional changes are made to a flip chip die, a new substrate may be needed to be fabricated for the flip chip package to enable the functional changes.

Thus, what is needed are ways of enabling functional flexibility in flip chip packages that do not require substantial modification of the flip chip packages when a change in functionality is desired.

BRIEF SUMMARY OF THE INVENTION

Methods, systems, and apparatuses for integrated circuit package substrates, integrated circuit packages, and processes for assembling the same, are provided. In a first aspect of the present invention, a substrate for a flip chip integrated circuit package is provided. The substrate includes a substrate body having opposing first and second surfaces. A first electrically conductive feature is formed on the first surface of the substrate body. A second electrically conductive feature is formed on the first surface of the substrate body that is proximate to the first electrically conductive feature. A solder mask layer covers at least a portion of the first surface of the substrate body. The first electrically conductive feature is a portion of a first electrical signal net of the substrate, and the second electrically conductive feature is a portion of a second electrical signal net of the substrate. The first and second electrically conductive features are configured to be selectively electrically coupled together by application of an electrically conductive material.

In one aspect, the first and second electrically conductive features may be left unelectrically coupled, or may be treated to disable them from being electrically coupled. For instance, the solder mask layer may be formed to cover the first electrically conductive feature and the second electrically conductive feature.

In another aspect, the first and second electrically conductive features may be selected to be electrically coupled together. For instance, an opening in the solder mask layer may overlap the first electrically conductive feature and the second electrically conductive feature. An electrically conductive material applied at the opening may be used to electrically couple the first electrically conductive feature and the second electrically conductive feature.

The electrically conductive material may be any electrically conductive material, including a conductive epoxy, a jumper, a solder paste, a solder ball, or a solder bump that couples a flip chip die to the substrate.

The first and second electrically conductive features may have any form. For instance, the second electrically conductive feature may be formed in a ring that substantially surrounds the first electrically conductive feature. In further examples, the first and second electrically conductive features may be adjacent rectangular shapes, may be adjacent half-circle shapes, or may be other shapes.

In a further aspect of the present invention, an integrated circuit package may include the substrate.

In a still further aspect of the present invention, a method for assembling a flip chip integrated circuit package is provided. A first electrically conductive feature and a second electrically conductive feature are formed on a first surface of a substrate. The first electrically conductive feature is a portion of a first electrical signal net of the substrate, and the second electrically conductive feature is a portion of a second electrical signal net of the substrate. The first and second electrically conductive features are electrically isolated from each other in the substrate. A solder mask layer is applied over at least a portion of the first surface of the substrate. The first and second electrically conductive features are configured to be selectively electrically coupled together by application of an electrically conductive material.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Integrated Circuit Packages

Figure 1:
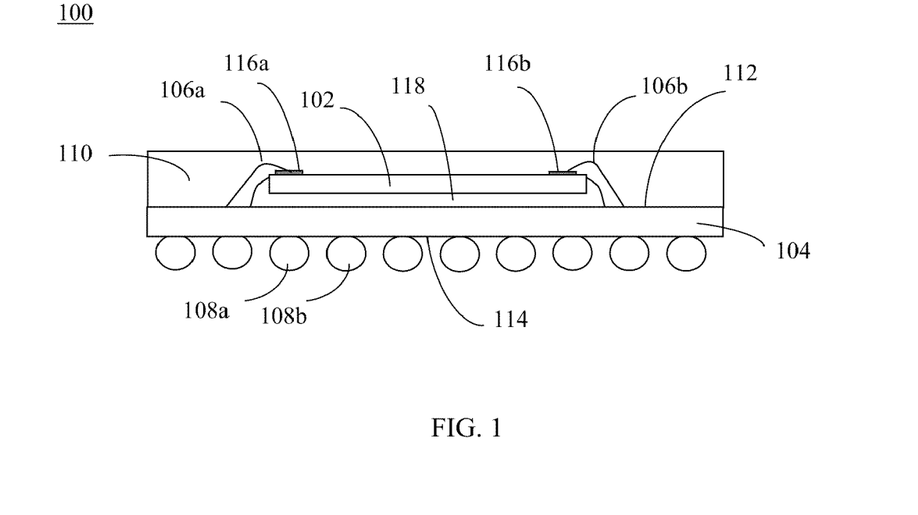
FIG. 1 shows a cross-sectional side view of an example BGA package.

Example integrated circuit packages are described in this section. FIG. 1 shows a cross-sectional view of an example BGA package 100. BGA package 100 may be a plastic BGA (PBGA) package, a flex BGA package, a ceramic BGA package, a fine pitch BGA (FPBGA or FBGA) package, or other type of BGA package. BGA package 100 includes an integrated circuit die/chip 102, a substrate 104, bond wires (also known as "wire bonds") 106, a plurality of solder balls 108, and an encapsulating material 110. Substrate 104 has a first (e.g., top) surface 112 that is opposed to a second (e.g., bottom) surface 114 of substrate 104. As shown in FIG. 1, die 102 is mounted to first surface 112 of substrate 104. Die 102 may be mounted to substrate 104 using an adhesive material 118.

As shown in FIG. 1, a plurality of bond wires 106 are coupled between terminals 116 of die 102 and electrically conductive features, such as traces, bond fingers, etc. (not shown in FIG. 1), at first surface 112 of substrate 104. For example, a first bond wire 106a is connected between a terminal 116a and first surface 112 of substrate 104, and a second bond wire 106b is connected between a terminal 116b and first surface 112 of substrate 104. Any number of bond wires 106 may be present, depending on a number of signals (at terminals 116) of die 102 to be coupled to conductive features of first surface 112 of substrate 104. Bond wires 106 may be wires formed of any suitable electrically conductive material, including a metal such as gold, silver, copper, aluminum, other metal, or combination of metals/alloy. Bond wires 106 may be attached according to wire bonding techniques and mechanisms well known to persons skilled in the relevant art(s).

As further shown in FIG. 1, encapsulating material 110 covers die 102 and bond wires 106 on first surface 112 of substrate 104. Encapsulating material 110 protects die 102 and bond wires 106 from environmental hazards. Encapsulating material 110 may be any suitable type of encapsulating material, including an epoxy, a mold compound, etc. Encapsulating material 110 may be applied in a variety of ways, including by a saw singulation technique, injection into a mold, etc.

Figure 2:
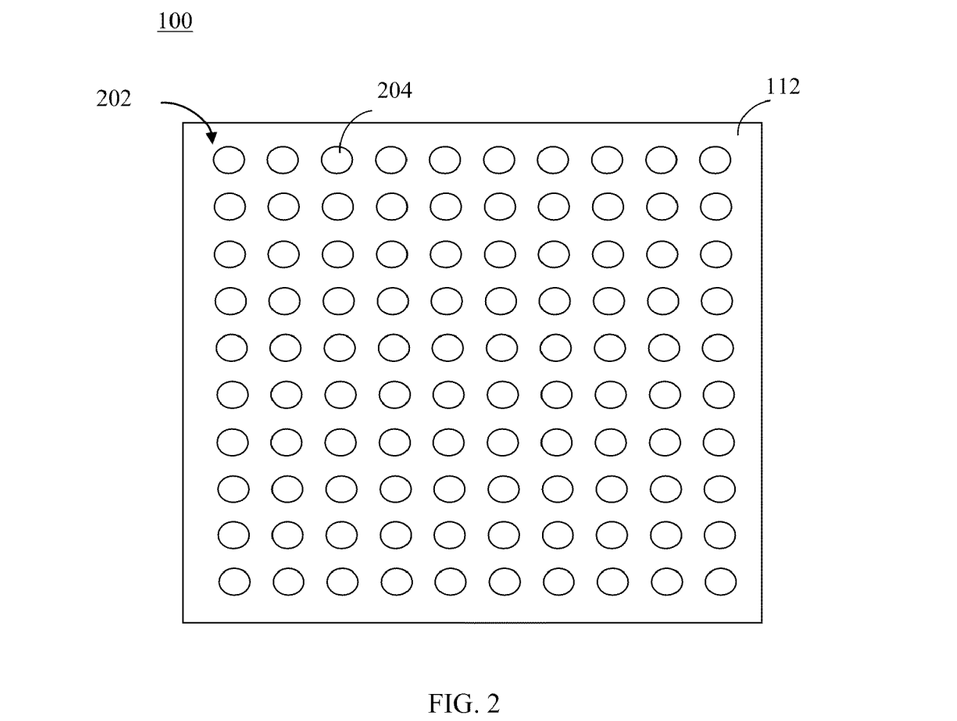
FIG. 2 shows a bottom view of the BGA package of FIG. 1.

A plurality of solder balls 108 (including solder balls 108a and 108b indicated in FIG. 1) is attached to second surface 114 of substrate 104. FIG. 2 shows a bottom view of second surface 114 of substrate 104. Solder balls 108 are not shown in FIG. 2. Instead, in FIG. 2, second surface 114 of substrate 104 includes an array 202 of solder balls pads 204. In the example of FIG. 2, array 202 includes one hundred solder ball pads 204 arranged in a 10 by 10 array. In other implementations, array 202 may include fewer or greater numbers of solder ball pads 204 arranged in any number of rows and columns. Solder ball pads 204 are attachment locations for solder balls 108 (shown in FIG. 1) on package 100. Solder ball pads 204 are electrically coupled through substrate 104 (e.g., by electrically conductive vias and/or routing) to the electrically conductive features (e.g., traces, bond fingers, contact regions, etc.) of first surface 112 of substrate 104 to enable signals of die 102 to be electrically connected to solder balls 108. Note that FIG. 2 shows a full array of solder ball pads 204. In some embodiments, array 202 of solder ball pads 204 may be missing some pads 204, so that array 202 is not necessarily a full array of solder balls 108 on second surface 114.

Substrate 104 may include one or more electrically conductive layers (such as at first surface 112) that are separated by one or more electrically insulating layers. An electrically conductive layer may include traces/routing, bond fingers, contact pads, and/or other electrically conductive features. For example, BGA substrates having one electrically conductive layer, two electrically conductive layers, or four electrically conductive layers are common. The electrically conductive layers may be made from an electrically conductive material, such as a metal or combination of metals/alloy, including copper, aluminum, tin, nickel, gold, silver, etc. In embodiments, substrate 104 may be rigid or may be flexible (e.g., a "flex" substrate). The electrically insulating layer(s) may be made from ceramic, plastic, tape, and/or other suitable materials. For example, the electrically insulating layer(s) of substrate 104 may be made from an organic material such as BT (bismaleimide triazine) laminate/resin, a flexible tape material such as polyimide, a flame retardant fiberglass composite substrate board material (e.g., FR-4), etc. The electrically conductive and non-conductive layers can be stacked and laminated together, or otherwise attached to each other, to form substrate 104, in a manner as would be known to persons skilled in the relevant art(s).

Figure 3:
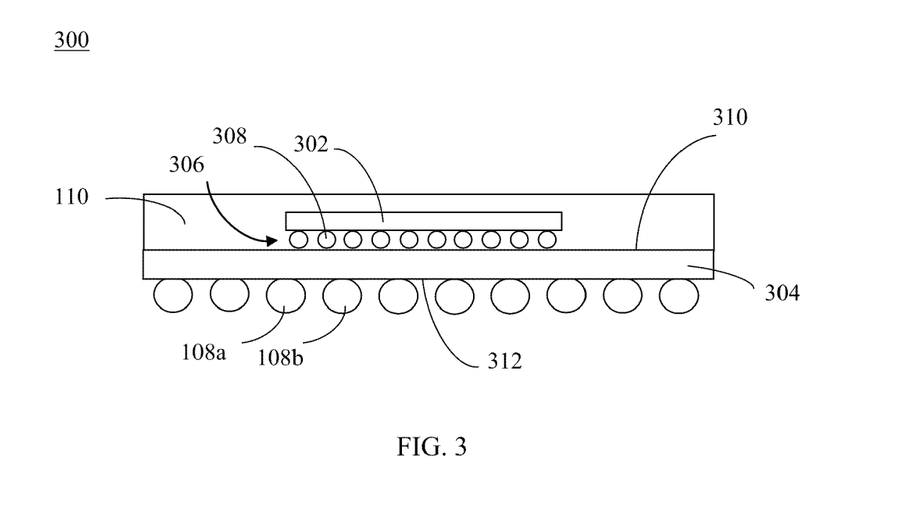
FIG. 3 shows a side cross-sectional view of a flip chip BGA package.

FIG. 3 shows another type of BGA package, referred to as a "flip chip BGA package." FIG. 3 shows a side cross-sectional view of a flip chip BGA package 300. As shown in FIG. 3, flip chip BGA package 300 includes an integrated circuit die/chip 302, a substrate 304, plurality of solder balls 108, a plurality of solder bumps/balls 306, and encapsulating material 110. Flip chip BGA package 300 is similar to BGA package 100 shown in FIGS. 1 and 2, except that die 302 is a flip chip integrated circuit die/chip, and substrate 304 is a flip chip substrate. Substrate 304 is similar to substrate 104 of BGA package 100, having opposing surfaces 310 (e.g., top) and 312 (e.g., bottom), with some differences described as follows.

Figure 4:
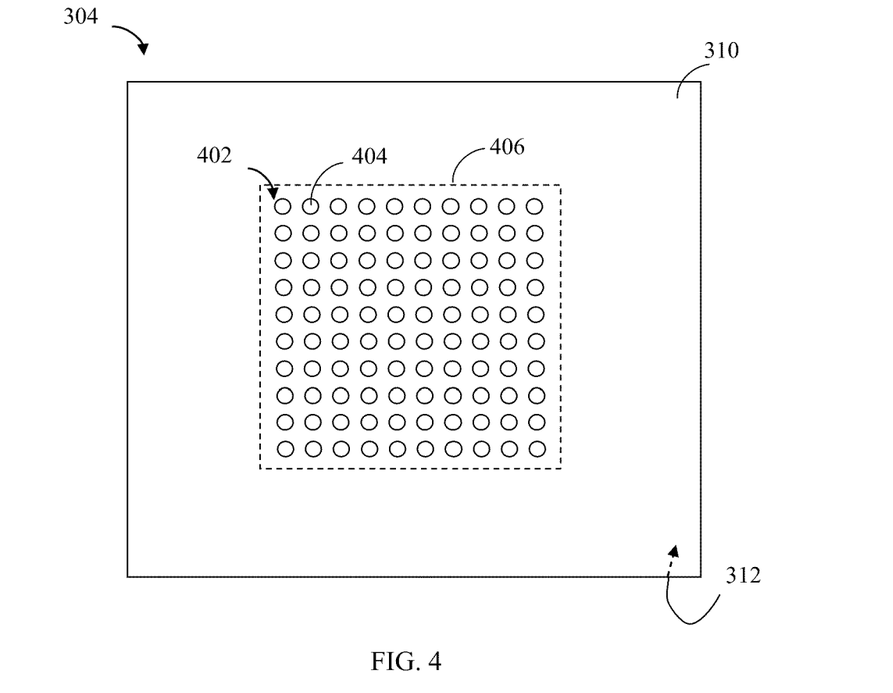
FIG. 4 shows a view of a surface of the substrate of the flip chip BGA package of FIG. 3.

As shown in FIG. 3, rather than using bond wires 106 to couple signals of die 102 to substrate 104 as shown in FIG. 1, die 302 is attached to substrate 304 in a "flip chip" manner. Solder bumps 306 are formed on the signal pads/terminals of die 302. Die 302 is attached to substrate 304 in an inverted ("flipped") orientation with respect to the attachment of die 102 to substrate 104 in FIG. 1. Die 302 is attached to substrate 304 by reflowing solder bumps 306 so that solder bumps 306 attach to corresponding pads on a (top) surface 310 of substrate 304. FIG. 4 shows a view of surface 310 of substrate 304. As shown in FIG. 4, surface 310 of substrate 304 has a mounting region 406 for a flip chip die, such as die 302. Mounting region 406 includes an array 402 of solder ball/bump pads corresponding to solder bumps 306. In the example of FIG. 4, array 402 includes a ten by ten array of pads 404. However, any number of pads 404 may be present in mounting region 406, depending on the number of solder bumps 306 on the flip chip die to be mounted thereto. When die 302 is mounted to mounting region 406 of substrate 304, solder bumps 306 attach to pads of array 402 on substrate 304. For example, a solder bump/ball 308 shown in FIG. 3 may attach to solder ball/bump pad 404 shown in FIG. 4 when die 302 is mounted to substrate 304.

For BGA package 100 shown in FIG. 1, various functions of die 102 can be turned on/off through the use of bond wires 106. For example, a first signal net in substrate 104 of BGA package 100 can be activated by coupling the first signal net to die 102 using a bond wire. A second signal net in substrate 104 may be deactivated by not wire bonding to the second signal net, or by coupling the second signal net to a particular voltage (e.g., a ground potential or other turn-off voltage) of die 102 using a bond wire. Thus, bond wires 106 enable some amount of functional flexibility to BGA package 100, which may be useful during testing and/or during other applications of BGA package 100. In contrast, flip chip BGA package 300 does not provide similar functional flexibility because a particular solder bump of die 302, such as solder bump 308, can only connect to pad 404 directly opposite the solder bump on substrate 304. Thus, when changes are made to the functionality of flip chip die 302, a new substrate 304 may need to be fabricated for flip chip package 300 to accommodate the changes. However, design and/or manufacture of a modified substrate 304 can be time consuming and expensive.

Embodiments of the present invention enable functional flexibility in flip chip package similar to the functional flexibility described above for non-flip chip BGA packages, without the need for a new package substrate. Example embodiments are further described in the following section.

Example Embodiments

The example embodiments described herein are provided for illustrative purposes, and are not limiting. Although described below with reference to BGA packages, the examples described herein may be adapted to other types of integrated circuit packages. Furthermore, additional structural and operational embodiments, including modifications/alterations, will become apparent to persons skilled in the relevant art(s) from the teachings herein.

Figure 5:
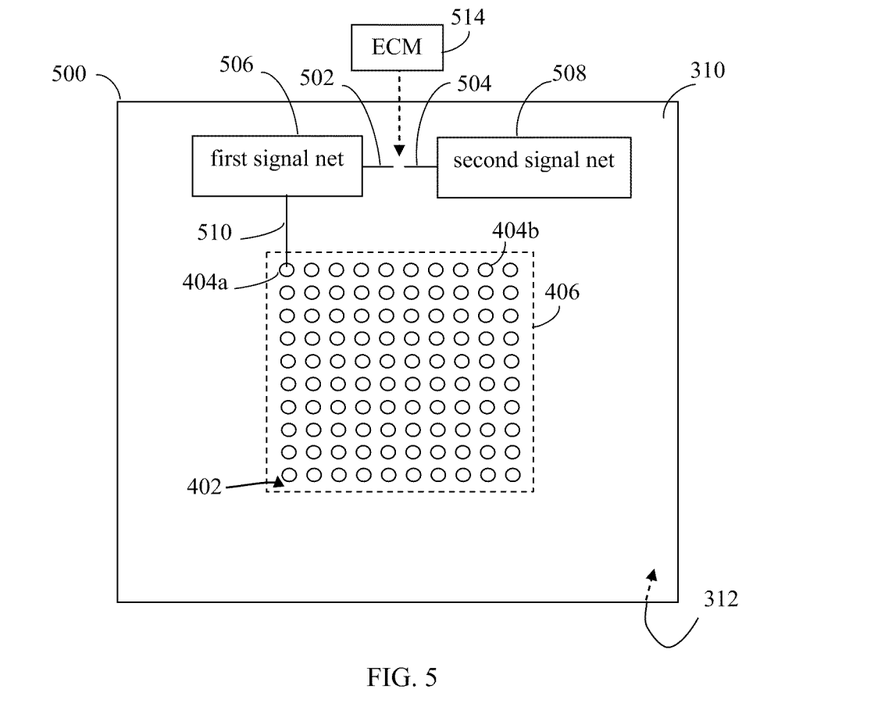
FIG. 5 shows a view of surface of a substrate of a flip chip BGA package, configured according to an embodiment of the present invention.

Embodiments of the present invention may be implemented in substrates of integrated circuit packages, such as substrates of flip chip BGA packages. For example, FIG. 5 shows a view of surface 310 of a substrate 500, configured according to an embodiment of the present invention. Substrate 500 is generally similar to substrate 304 shown in FIGS. 3 and 4, with some differences described below. Substrate 500 may be fabricated into a BGA package, such as flip chip BGA package 300 shown in FIG. 3.

As shown in FIG. 5, surface 310 of substrate 500 includes a first electrically conductive feature 502 and a second electrically conductive feature 504. Alternatively, first and second electrically conductive features 502 and 504 may be positioned on surface 312 of substrate 500. Mounting region 406 is also shown on surface 310 of substrate 500 in FIG. 5. As described above, mounting region 406 may be used to mount a flip chip die, such as flip chip die 302 shown in FIG. 3.

First electrically conductive feature 502 (e.g., a trace, bond finger, conductive pad, etc.) is a portion of a first electrical signal net 506 of substrate 500, and second electrically conductive feature 504 is a portion of a second electrical signal net 508 of substrate 500. First and second signal nets 506 and 508 may be entirely located on surface 310 of substrate 500, may be entirely located on surface 312 of substrate 500, or may have portions that are present on any number of one or more surfaces and layers of substrate 500. First and second signal nets 506 and 508 may each include one or more electrically conductive traces, bond fingers, vias, pads, and/or any other electrically conductive features. First and second signal nets 506 and 508 may be made of any suitable electrically conductive material(s), such as a metal or combination of metals/alloy mentioned elsewhere herein or otherwise known.

As shown in the embodiment of FIG. 5, first electrically conductive feature 502 is proximate to second electrically conductive feature 504 on surface 310. First electrically conductive feature 502 is electrically isolated from second electrically conductive feature 504 in substrate 500. However, first and second electrically conductive features 502 and 504 are configured to be selectively electrically coupled together by application of an electrically conductive material (ECM) 514 to surface 310 (or to surface 312, when features 502 and 504 are located on surface 312), to create an electrically conductive path between first and second electrically conductive features 502 and 504. Electrically conductive material 514 may be a solder paste, an electrically conductive epoxy, a solder ball, a jumper (e.g., a metal wire or rod), or any other suitable electrically conductive material mentioned elsewhere herein or otherwise known. When electrically conductive material 514 couples together first and second electrically conductive features 502 and 504, the signals of first and second signal nets 506 and 508 are electrically coupled together. In this manner, functional flexibility is provided, similar to the functional flexibility available in wire bond BGA packages described above.

For example, as shown in FIG. 5, first signal net 506 includes an electrically conductive feature 510, which electrically couples first signal net 506 to pad 404a of array 402. Second signal net 508 is not electrically coupled to a pad 404 of array 402. In such an embodiment, second signal net 508 may be a floating, inactive signal net of substrate 500. When, when flip chip die 302 is mounted to substrate 500 at mounting region 406, a first die terminal/pad of die 302 that attaches to pad 404a is electrically coupled to first signal net 506. When electrically conductive material 514 couples together first and second electrically conductive features 502 and 504, the signal of die 302 at the die terminal/pad coupled to pad 404a is electrically coupled to second signal net 508 through first signal net 506. By coupling second signal net 508 to the signal of die 302 at the die terminal/pad coupled to pad 404a, second signal net 508 may be activated or deactivated, as desired.

In another embodiment, first signal net 506 may be electrically coupled to pad 404a by electrically conductive feature 510, and second signal net 508 is electrically coupled to a pad 404 (e.g., pad 404b) of array 402. When electrically conductive material 514 is applied to couple together first and second electrically conductive features 502 and 504, pads 404a and 404b are electrically coupled together through first and second signal nets 506 and 508. In this manner, second signal net 508 may be activated or deactivated by being electrically coupled to first signal net 506, as desired.

Figure 6:
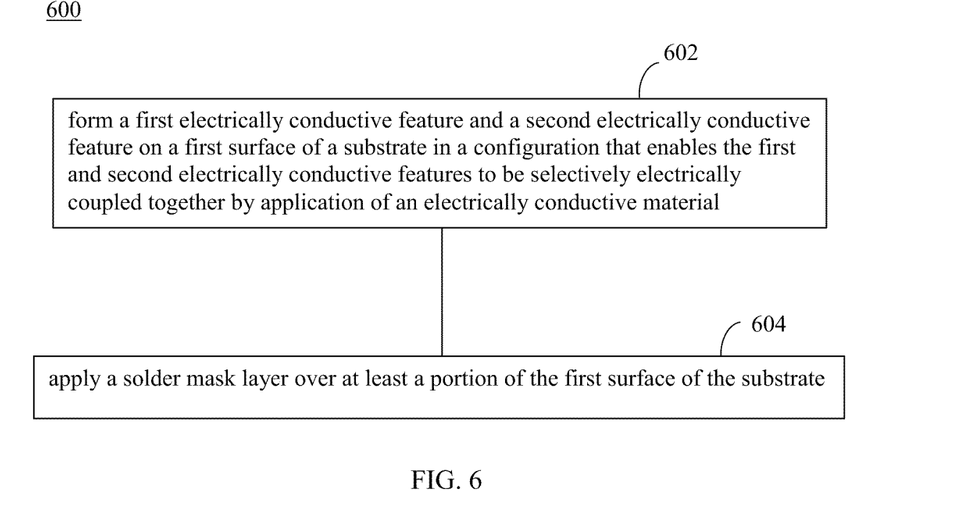
FIG. 6 shows a flowchart providing a process for assembling an integrated circuit (IC) package, according to example embodiments of the present invention.

Thus, by applying electrically conductive material 514 to the circuit configurations just described, and/or to further circuit configurations, functional flexibility may be achieved in integrated circuit packages that include substrate 500. Such integrated circuit packages may be fabricated/assembled in any manner. For instance, FIG. 6 shows a flowchart 600 providing a process for assembling an integrated circuit package, according to embodiments of the present invention. In an embodiment, a flip chip BGA package may be assembled according to flowchart 600 to include substrate 500 shown in FIG. 5. Other structural and operational embodiments will be apparent to persons skilled in the relevant art(s) based on the discussion regarding flowchart 600. Note that conventional steps for assembling a flip chip integrated circuit package are not shown in FIG. 6 for purposes of brevity, and because they will be known to persons skilled in the relevant art(s). Such steps may include attaching solder balls (e.g., solder balls 108) to substrate 500, forming solder bumps (e.g., solder bumps 308) on a flip chip die (e.g., flip chip die 302), mounting a die to substrate 500 in a flip chip orientation, encapsulating a die on substrate 500 (e.g., with encapsulating material 110), etc. Flowchart 600 is described as follows.

Flowchart 600 begins with step 602. In step 602, a first electrically conductive feature and a second electrically conductive feature are formed on a first surface of a substrate in a configuration that enables the first and second electrically conductive features to be selectively electrically coupled together by application of an electrically conductive material. For example, in an embodiment, the first electrically conductive feature may be first electrically conductive feature 502 and the second electrically conductive feature may be second electrically conductive feature 504 shown in FIG. 5. As shown in FIG. 5, first and second electrically conductive features 502 and 504 are formed proximate to each other to enable them to be selectively electrically coupled together by application of electrically conductive material 514. Note that first and second electrically conductive features 502 and 504 may be formed in any manner, including by conventional substrate fabrication processes.

In step 604, a solder mask layer is applied over at least a portion of the first surface of the substrate. For example, in an embodiment, a standard solder mask/solder resist layer may be formed over surface 310 of substrate 500 shown in FIG. 5. The solder mask layer may be formed on surface 310 according to standard substrate fabrication processes to protect electrically conductive features on surface 310 and/or to prevent solder from bridging between electrically conductive features on surface 310. The solder mask layer may be patterned onto surface 310 in any manner, conventional or otherwise. For example, the solder mask layer may be a layer of an epoxy liquid that is silkscreened through a pattern onto surface 310. Alternatively, the solder mask layer may be a photoimageable solder mask (LPSM) ink or a dry film photoimageable solder mask (DFSM). According to LPSM, an ink may be silkscreened or sprayed onto surface 310, exposed to a desired pattern, and developed to provide openings in the pattern as desired. According to DFSM, the solder mask layer may be vacuum laminated on surface 310, exposed to the desired pattern, and developed. A thermal cure may be performed after defining the solder mask pattern. Any technique for forming a solder mask layer on substrate 310 may be used in step 604, as would be known to persons skilled in the relevant art(s).

Further example steps for flowchart 600 are described as follows. For instance, as described above, first and second electrically conductive features 502 and 504 may be selectively electrically coupled together by application of electrically conductive material 514. In a first situation, a non-electrically coupled configuration for first and second electrically conductive features 502 and 504 may be selected. First and second electrically conductive features 502 and 504 may not be electrically coupled together so that one of first and second electrical signal nets 506 and 508 is not activated or deactivated, for instance. In a second situation, first and second electrically conductive features 502 and 504 may be selected to be electrically coupled together. First and second electrically conductive features 502 and 504 may be electrically coupled together to activate or deactivate one of first and second electrical signal nets 506 and 508.

Figure 7:
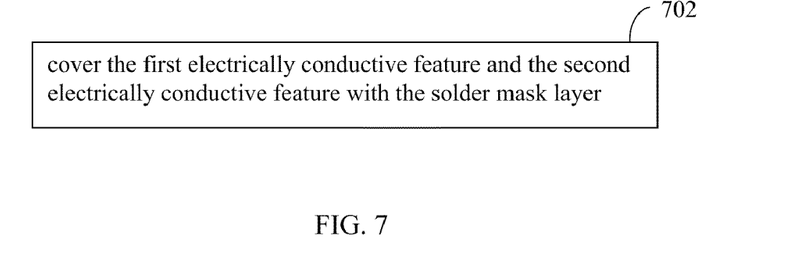
FIG. 7 shows a step that may be performed during the flowchart of FIG. 6, according to an example embodiment of the present invention.
Figure 8:
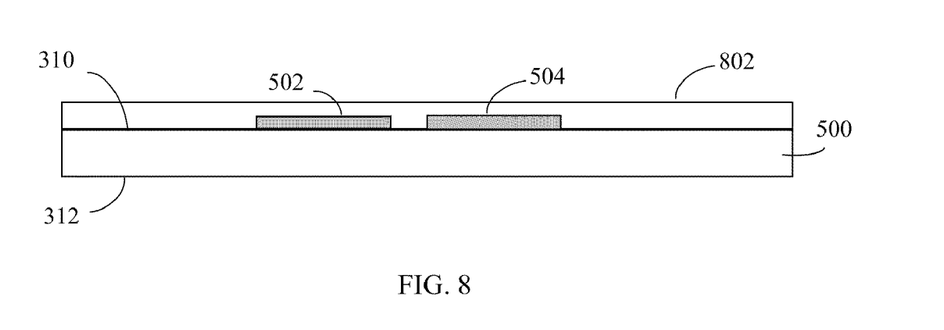
FIG. 8 shows a side cross-sectional view of a portion of flip chip substrate, according to an example embodiment of the present invention.

Step 702 shown in FIG. 7 may be performed during step 604 of flowchart 600 so that first and second electrically conductive features 502 and 504 are not electrically coupled together. In step 702, the first electrically conductive feature and the second electrically conductive feature are covered with the solder mask layer. For example, FIG. 8 shows a side cross-sectional view of a portion of substrate 500, according to an embodiment of the present invention. In FIG. 8, first and second electrically conductive features 502 and 504 are located on surface 310 of substrate 500, and are not electrically coupled together. In an alternative embodiment, first and second electrically conductive features 502 and 504 may be located on surface 312 of substrate 500. A solder mask layer 802 is formed on surface 310 of substrate 500. During formation of solder mask layer 802, first and second electrically conductive features 502 and 504 are covered by solder mask layer 802. In this manner, first and second electrically conductive features 502 and 504 remain in a non-electrically coupled condition, and are protected by solder mask layer 802 from being accidentally shorted together.

Figure 9:
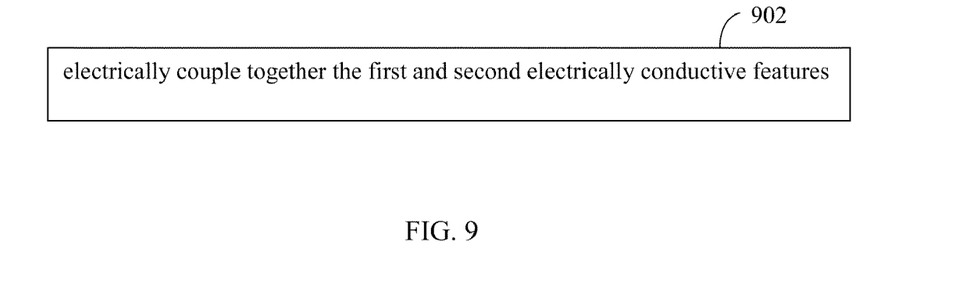
FIG. 9 shows a process that may be performed during the flowchart of FIG. 6, according to an example embodiment of the present invention.

In the second situation described above, it may be desired to couple together first and second electrically conductive features 502 and 504. Step 902 shown in FIG. 9 may be performed during flowchart 600 in this situation. In step 902, the first and second electrically conductive features electrically coupled together. First and second electrically conductive features 502 and 504 may be electrically coupled together by applying electrically conductive material 514 to substrate 500 to create an electrical connection between first and second electrically conductive features 502 and 504. Step 902 may be performed in any manner.

Figure 10:
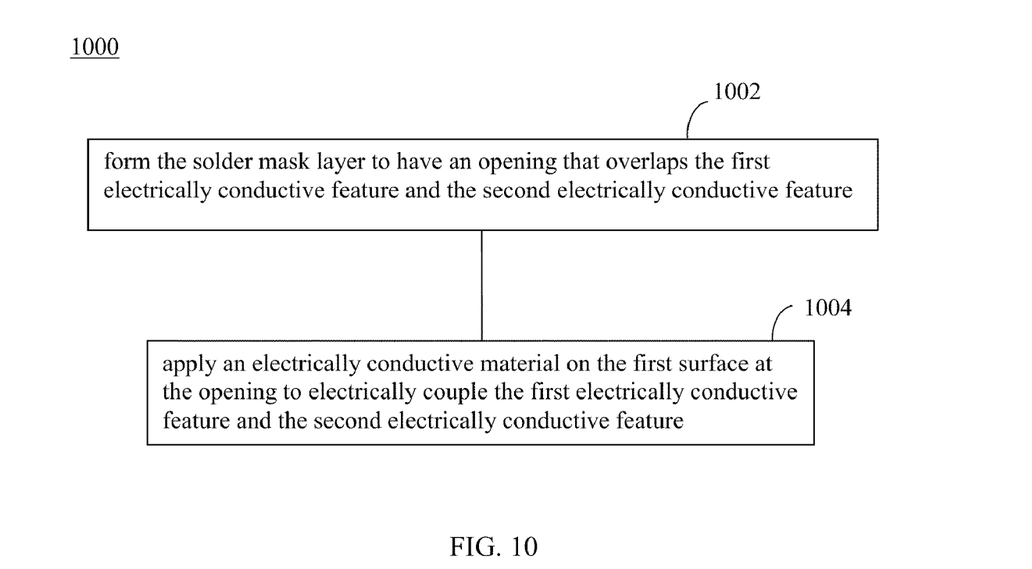
FIG. 10 shows a flowchart providing a process for electrically coupling together first and second electrically conductive features, according to embodiments of the present invention.

For example, FIG. 10 shows a flowchart 1000 providing a process for electrically coupling together first and second electrically conductive features 502 and 504, according to embodiments of the present invention. Flowchart 1000 is described as follows.

Figure 11:
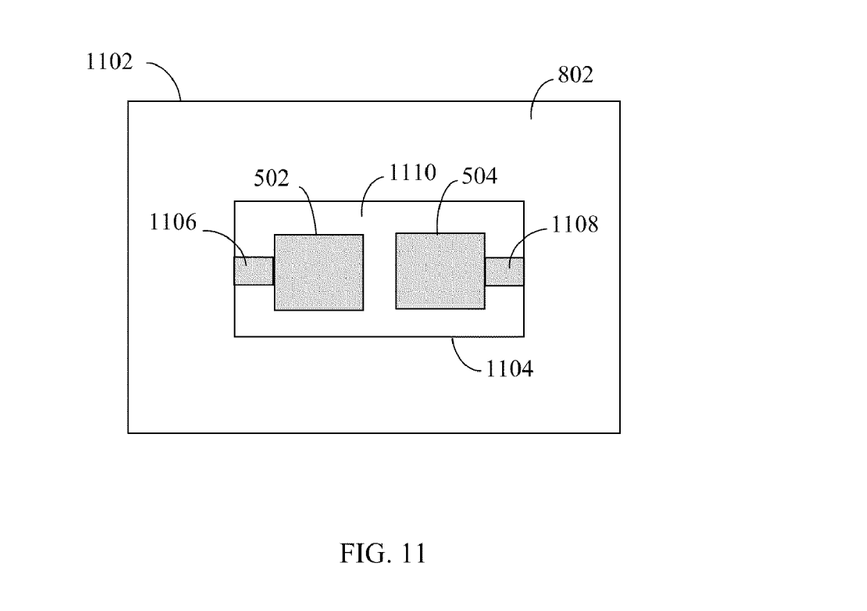
FIG. 11 shows a view of an opening in a solder mask layer that exposes first and second electrically conductive features, according to an embodiment of the present invention.

Flowchart 1000 begins with step 1002. In step 1002, the solder mask layer is formed to have an opening that overlaps the first electrically conductive feature and the second electrically conductive feature. For example, FIG. 11 shows a view of a portion 1102 of substrate 500, according to an embodiment of the present invention. As shown in FIG. 11, solder mask layer 802 covers portion 1102, except for at an opening 1104. Opening 1104 overlaps first and second electrically conductive features 502 and 504 so that first and second electrically conductive features 502 and 504 are not covered by solder mask layer 802 (and a portion 1110 of a surface of substrate 500 is not covered by layer 802). As shown in the example of FIG. 11, first electrically conductive feature 502 is not covered by layer 802, and is coupled to the remainder of first electrical signal net 506 by a trace 1106. Second electrically conductive feature 504 is not covered by layer 802, and is coupled to the remainder of second electrical signal net 508 by a trace 1108. In embodiments, any portion of first and second electrically conductive features 502 and 504 may overlap opening 1104.

Opening 1104 may be formed in solder mask layer 802 in any manner, such as by first applying solder mask layer 802 to portion 1102 and subsequently patterning opening 1104 through layer 802, or by applying solder mask layer 802 to all of portion 1102 except for the region defined by opening 1104.

Figure 12:
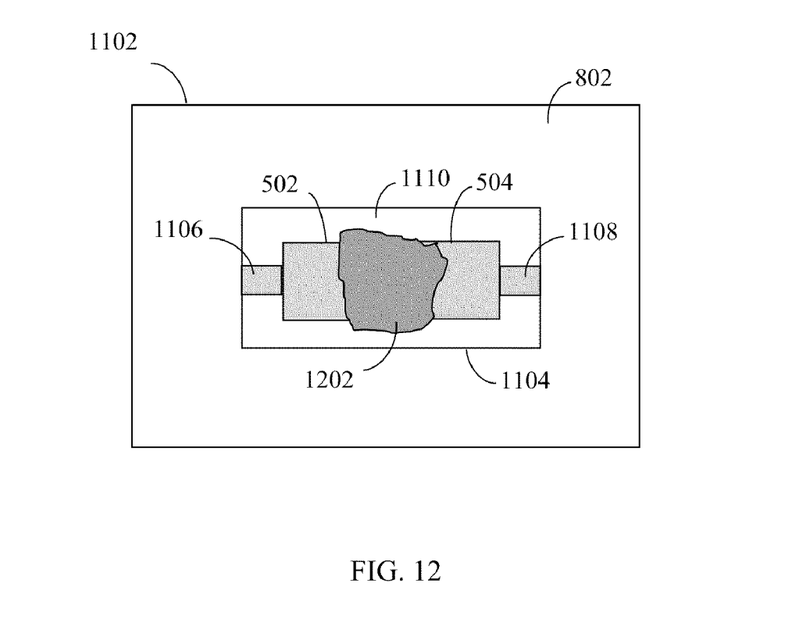
FIG. 12 shows an electrically conductive material applied to the opening shown in FIG. 11, according to an embodiment of the present invention.

In step 1004, an electrically conductive material is applied on the first surface at the opening to electrically couple the first electrically conductive feature and the second electrically conductive feature. For example, FIG. 12 shows an electrically conductive material 1202 applied in opening 1104, according to an embodiment of the present invention. Electrically conductive material 1202 is in contact with both of first and second electrically conductive features 502 and 504, and electrically couples first and second electrically conductive features 502 and 504 together. Electrically conductive material 1202 may be applied to portion 1102 in any manner, including manually, such as by a hand-held conductive material dispensing tool, or in an automated fashion. For example, a computer controlled conductive material dispensing tool may be used to apply material 1202, such as a wave solder machine or other solder machine.

First and second electrically conductive features 502 and 504 are shown in FIGS. 11 and 12 as both having a rectangular shape. In alternative embodiments, first and second electrically conductive features 502 and 504 can have other shapes, including a geometrical shape such as round, elliptical, oval, triangular, or any other polygon, or being irregular in shape. As described above, first and second electrically conductive features 502 and 504 can be circuit traces, bond fingers, or other conductive feature.

Figure 13:
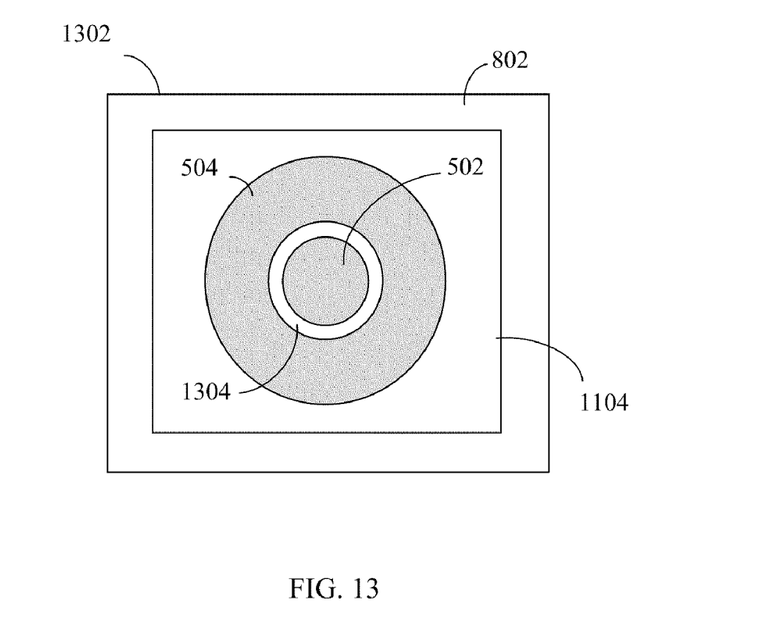
FIGS. 13 and 14 show examples of first and second electrically conductive features formed in concentric rounded shapes, according to embodiments of the present invention.
Figure 14:
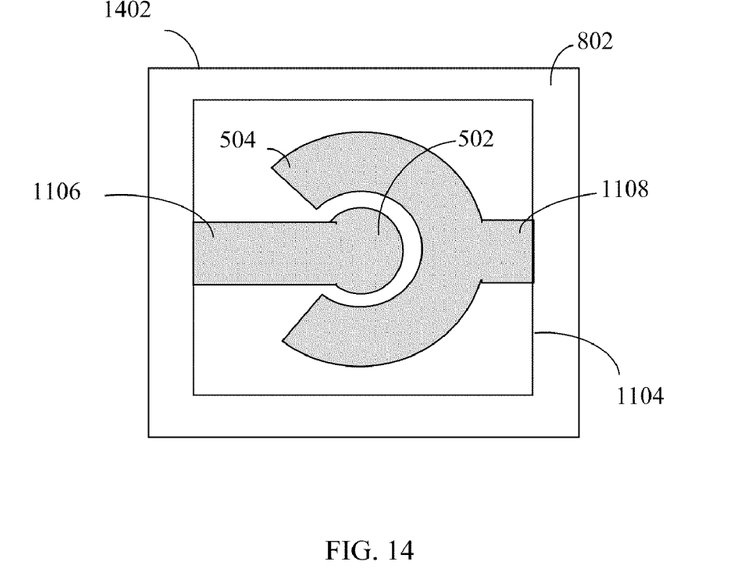

In an embodiment, one of first and second electrically conductive features 502 and 504 may partially or entirely encircle/enclose the other of first and second electrically conductive features 502 and 504. For example, FIG. 13 shows first and second electrically conductive features 502 and 504, shaped according to another embodiment of the present invention. As shown in FIG. 13, first and second electrically conductive features 502 and 504 are concentric circles on a portion 1302 of substrate 500, such that first electrically conductive feature 502 is ringed by second electrically conductive feature 504. First and second electrically conductive features 502 and 504 are separated by a circular gap 1304. In the example of FIG. 13, first electrically conductive feature 502 is substantially round in shape, and second electrically conductive feature 504 has a substantially round ring shape. While in FIG. 13 second electrically conductive feature 504 is shown completely ringing first electrically conductive feature 502, in other embodiments, second electrically conductive feature 504 may partially ring first electrically conductive feature 502. For example, FIG. 14 shows first and second electrically conductive features 502 and 504 on a portion 1402 of substrate 500, shaped according to another embodiment of the present invention. In FIG. 14, second electrically conductive feature 504 is not a full ring (is a partial ring), and thus partially rings first electrically conductive feature 502.

Figure 15:
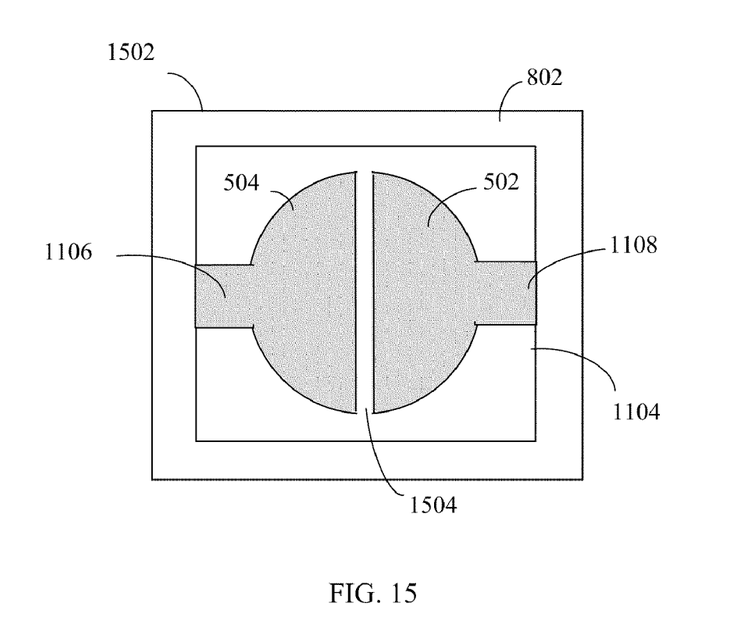
FIG. 15 shows an example of first and second electrically conductive features formed as a pair of adjacent half-circles, according to an embodiment of the present invention.

Furthermore, although shown having rounded shapes in FIGS. 13 and 14, first and second electrically conductive features 502 and 504 may have other shapes that enable one of first and second electrically conductive features 502 and 504 to partially or entirely encircle the other. For instance, second electrically conductive feature 504 may be a rectangular ring shape that rings a rectangular shaped first electrically conductive feature 502. For example, FIG. 15 shows first and second electrically conductive features 502 and 504 on a portion 1502 of substrate 500, shaped according to another embodiment of the present invention. In FIG. 15, first and second electrically conductive features 502 and 504 are each formed as a half circle. The flat edges of first and second electrically conductive features 502 and 504 are proximate to each other, separated by a rectangular gap 1504.

First and second electrically conductive features 502 and 504 may be coupled to their respective one of first and second electrical signal nets 506 and 508 in any manner. In the example of FIG. 13, first and second electrically conductive features 502 and 504 may be respectively coupled to their respective electrical signal nets through substrate 500 (e.g., using vias). In the example of FIG. 14, first and second electrically conductive features 502 and 504 are electrically coupled to their respective electrical signal nets by traces 1106 and 1108.

Figure 16:
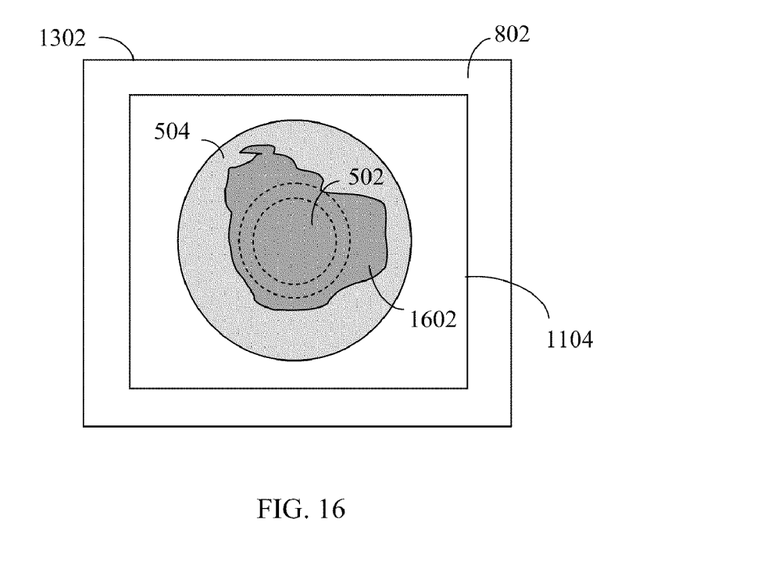
FIG. 16 shows an electrically conductive material applied to the first and second electrically conductive features shown in FIG. 13, according to an embodiment of the present invention.
Figure 17:
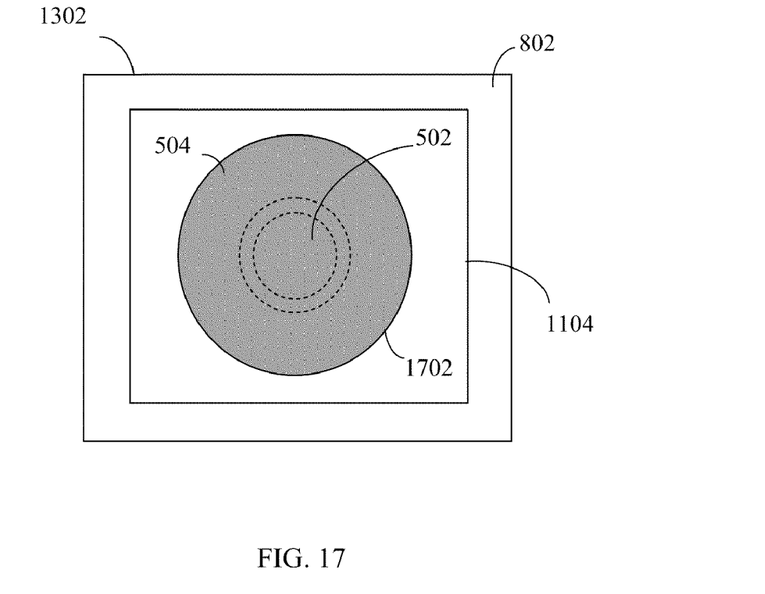
FIG. 17 shows a solder ball applied to the first and second electrically conductive features shown in FIG. 13, according to an embodiment of the present invention.

According to step 1002 of flowchart 1000 shown in FIG. 10, first and second electrically conductive features 502 and 504 shown in FIGS. 13-15 may be exposed through an opening 1104 though solder mask layer 802. An electrically conductive material may be applied to first and second electrically conductive features 502 and 504 according to step 1004 of flowchart 1000 in any manner. For example, FIG. 16 shows an electrically conductive material 1602 applied to first and second electrically conductive features 502 and 504 of FIG. 13, according to an embodiment of the present invention. In the example of FIG. 16, electrically conductive material 1602 may be a solder paste, an electrically conductive epoxy, or other electrically conductive material that is applied in opening 1104. In another embodiment, as shown in FIG. 17, a solder ball 1702 may be applied to first and second electrically conductive features 502 and 504 to electrically couple together first and second electrically conductive features 502 and 504. Solder ball 1702 may be applied in any manner, including a using conventional or proprietary process. For instance, when first and second electrically conductive features 502 and 504 are located on second surface 312 of substrate 500, solder ball 1702 may be one of solder balls 108, as shown in FIG. 3. Thus, first and second electrically conductive features 502 and 504 may be electrically coupled together during the process of forming solder balls 108 on surface 312 of substrate 500.

Figure 18:
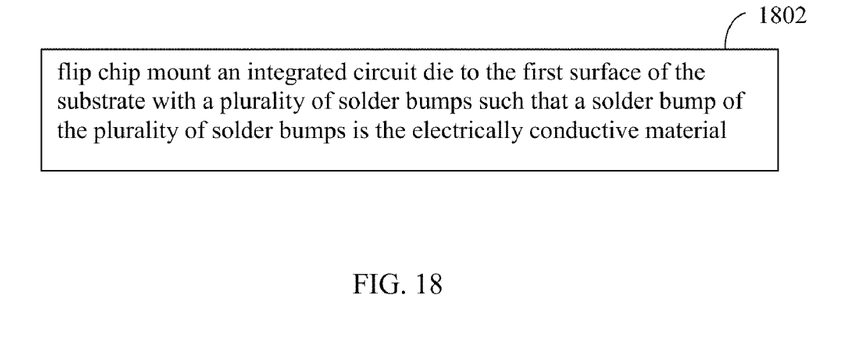
FIG. 18 shows a process that may be performed during the flowchart of FIG. 6 to electrically couple the first and second electrically conductive features shown in FIGS. 13-15, according to an example embodiment of the present invention.

Alternatively, when first and second electrically conductive features 502 and 504 are located on first surface 310 of substrate 500, solder ball 1702 may be one of solder bumps 308. Thus, first and second electrically conductive features 502 and 504 may be electrically coupled together during the process of mounting a die to mounting region 406 of substrate 500. For example, FIG. 18 shows a step 1802 that may be performed during the flowchart of FIG. 6 to electrically couple first and second electrically conductive features 502 and 504 shown in FIG. 13, according to an example embodiment of the present invention. In step 1802, an integrated circuit die is flip chip mounted to the first surface of the substrate with a plurality of solder bumps such that a solder bump of the plurality of solder bumps is the electrically conductive material. For example, in an embodiment, solder bump 308 of flip chip die 302 of FIG. 3 may electrically couple together first and second electrically conductive features 502 and 504 when flip chip die 302 is mounted to substrate 500, where first and second electrically conductive features 502 and 504 replace a pad 404 shown in FIG. 4.

Figure 19:
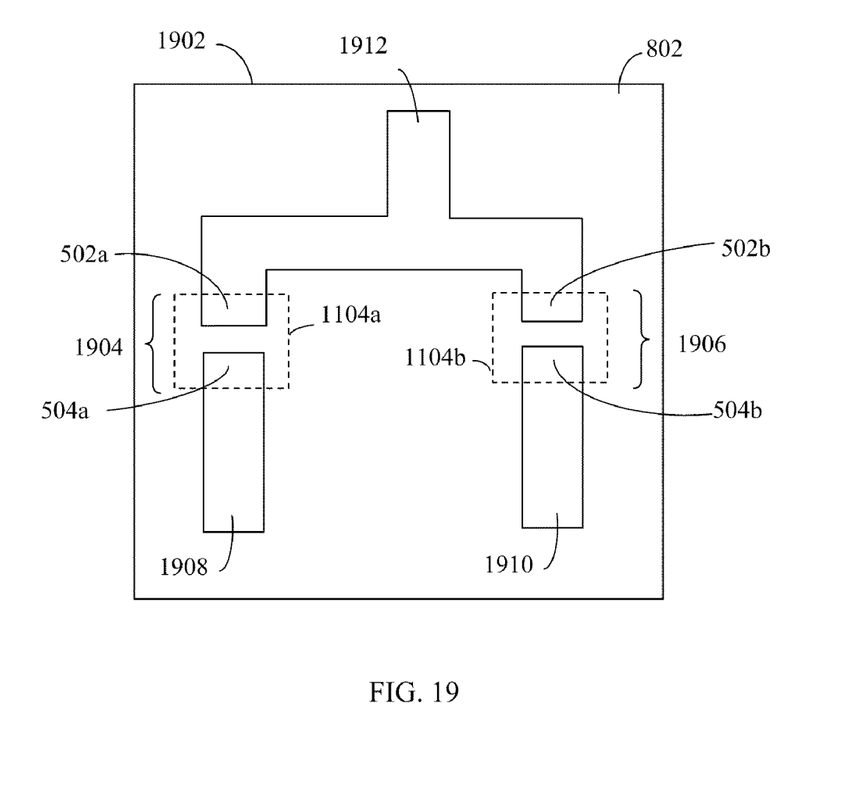
FIG. 19 shows a first selectively coupled conductor pair and a second selectively coupled conductor pair on a portion of a substrate, according to an example embodiment of the present invention.

Combinations any number of pairs of first and second electrically conductive features 502 and 504 may be positioned on substrates to selectively couple together any number of signal nets. For example, FIG. 19 shows a first selectively coupled conductor pair 1904 and a second selectively coupled conductor pair 1906 on a portion 1902 of substrate 500, according to another embodiment of the present invention. As shown in FIG. 19, first pair 1904 includes a first electrically conductive feature 502a and a second electrically conductive feature 504a, and second pair 1906 includes a first electrically conductive feature 502b and a second electrically conductive feature 504b. A solder mask layer on portion 1902 is not shown in FIG. 19, although the locations of an opening 1104a through the solder mask layer at first pair 1904 and an opening 1104b through the solder mask layer at second pair 1906 are indicated (by dotted lines). As shown in FIG. 19, first electrically conductive feature 502a and first electrically conductive feature 502b are both coupled to a first electrical conductor 1912, which is electrically coupled to a first electrical signal net. Second electrically conductive feature 504a of first pair 1904 is coupled to a second electrical conductor 1908, which is electrically coupled to a second electrical signal net. Second electrically conductive feature 504b of second pair 1906 is coupled to a third electrical conductor 1910, which is electrically coupled to a third electrical signal net.

Electrically conductive material 1202 may be applied in opening 1104a to electrically couple the features of first pair 1904, and/or may be applied in opening 1104b to electrically couple the features of second pair 1906. By selectively electrically coupling together first pair 1904 or second pair 1906 using an electrically conductive material, an electrical connection can be made from second electrical conductor 1908 or third electrical conductor 1910 to first electrical conductor 1912. By selectively electrically coupling together first pair 1904 and second pair 1906 using an electrically conductive material, first, second, and third electrical conductors 1912, 1908, and 1910 may be coupled together.

In embodiments, the first, second, and third electrical signal nets coupled to first, second, and third electrical conductors 1912, 1908, and 1910, respectively, may be any electrical signals, such as power, ground, or I/O signals, which may be coupled to one or more pads 404, to one or more solder balls 108, and/or to one or more other electrical features of the integrated circuit package.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A flip chip integrated circuit package, comprising:
a substrate having opposing first and second surfaces;
a solder mask layer that covers at least a portion of the first surface of the substrate; and
an opening in the solder mask layer;
wherein the first surface of the substrate has a first electrically conductive feature, a second electrically conductive feature, and a mounting region for a flip chip oriented integrated circuit die;
wherein the opening overlaps the first electrically conductive feature and the second electrically conductive feature;
wherein the first electrically conductive feature is a portion of a first electrical signal net of the substrate, and the second electrically conductive feature is a portion of a second electrical signal net of the substrate; and
wherein the first electrically conductive feature is proximate to the second electrically conductive feature, the first and second electrically conductive features each having an at least partially round shape, and the first and second electrically conductive features are configured to be selectively electrically coupled together by application of an electrically conductive material.

2. The package of claim 1, wherein the solder mask layer partially covers the first electrically conductive feature and the second electrically conductive feature.

3. The package of claim 1, further comprising:
an electrically conductive material on the first surface at the opening that electrically couples the first electrically conductive feature and the second electrically conductive feature.

4. The package of claim 3, wherein the electrically conductive material is a conductive epoxy, a jumper, a solder paste, or a solder ball.

5. The package of claim 3, further comprising:
an integrated circuit die that is flip chip mounted to the first surface of the substrate at the mounting region by a plurality of solder bumps.

6. The package of claim 5, wherein a solder bump of the plurality of solder bumps is the electrically conductive material.

7. The package of claim 1, wherein the second electrically conductive feature rings the first electrically conductive feature.

8. The package of claim 7, wherein the first electrically conductive feature has a substantially round shape and the second electrically conductive feature has a substantially round ring shape.

9. The package of claim 1, wherein the first and second electrically conductive features each have a half-circle shape.

10. A substrate for a flip chip integrated circuit package, comprising:
a substrate body having opposing first and second surfaces;
a solder mask layer that covers at least a portion of the first surface of the substrate body;
an opening in the solder mask layer;
a first electrically conductive feature on the first surface of the substrate body;
a second electrically conductive feature on the first surface of the substrate body that is proximate to the first electrically conductive feature; and
a mounting region for a flip chip oriented integrated circuit die on the first surface of the substrate body;
wherein the opening overlaps the first electrically conductive feature and the second electrically conductive feature;
wherein the first electrically conductive feature is a portion of a first electrical signal net of the substrate, and the second electrically conductive feature is a portion of a second electrical signal net of the substrate;
wherein the first and second electrically conductive features each have an at least partially round shape; and
wherein the first and second electrically conductive features are configured to be selectively electrically coupled together by application of an electrically conductive material.

11. The substrate of claim 10, wherein the solder mask layer partially covers the first electrically conductive feature and the second electrically conductive feature.

12. The substrate of claim 10, further comprising:
an electrically conductive material on the first surface at the opening that electrically couples the first electrically conductive feature and the second electrically conductive feature.

13. The substrate of claim 12, wherein the electrically conductive material is a conductive epoxy, a jumper, solder paste, or a solder ball.

14. The substrate of claim 10, wherein the second electrically conductive feature is formed in a ring that substantially surrounds the first electrically conductive feature.

15. The substrate of claim 14, wherein the first electrically conductive feature has a substantially round shape and the second electrically conductive feature has a substantially round ring shape.

16. The substrate of claim 10, wherein the first and second electrically conductive features each have a half-circle shape.

* * * * *

UNITED STATES PATENT AND TRADEMARK OFFICE
CERTIFICATE OF CORRECTION

| | | |
|---|---|---|
| PATENT NO. | : 8,138,608 B2 | |
| APPLICATION NO. | : 12/691255 | |
| DATED | : March 20, 2012 | |
| INVENTOR(S) | : Chonghua Zhong | |

It is certified that error appears in the above-identified patent and that said Letters Patent is hereby corrected as shown below:

In column 14, line 38, in claim 13, delete "solder" and insert -- a solder --, therefor.

Signed and Sealed this
Fourth Day of September, 2012

David J. Kappos
*Director of the United States Patent and Trademark Office*